United States Patent
Wang et al.

(10) Patent No.: US 9,111,942 B2
(45) Date of Patent: Aug. 18, 2015

(54) LOCAL INTERCONNECT STRUCTURE AND FABRICATION METHOD

(71) Applicant: Semiconductor Manufacturing International (Shanghai) Corporation, Shanghai (CN)

(72) Inventors: Dongjiang Wang, Shanghai (CN); Danny Huang, Shanghai (CN); Steven Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/141,035

(22) Filed: Dec. 26, 2013

(65) Prior Publication Data
US 2014/0191404 A1    Jul. 10, 2014

(30) Foreign Application Priority Data
Jan. 10, 2013    (CN) .......................... 2013 1 0009755

(51) Int. Cl.
*H01L 21/768* (2006.01)
*H01L 23/538* (2006.01)

(52) U.S. Cl.
CPC ...... *H01L 23/5386* (2013.01); *H01L 21/76816* (2013.01); *H01L 21/76895* (2013.01); *H01L 2924/0002* (2013.01)

(58) Field of Classification Search
CPC ................. H01L 21/76816; H01L 21/76895; H01L 2924/0002
USPC ....................................... 438/639
See application file for complete search history.

(56) References Cited

U.S. PATENT DOCUMENTS

| | | | | |
|---|---|---|---|---|
| 6,063,688 | A * | 5/2000 | Doyle et al. ................. | 438/424 |
| 6,638,441 | B2 * | 10/2003 | Chang et al. ................... | 216/46 |
| 7,271,107 | B2 * | 9/2007 | Marks et al. ................. | 438/717 |
| 7,271,108 | B2 * | 9/2007 | Sadjadi ........................ | 438/717 |
| 7,531,456 | B2 * | 5/2009 | Kwon et al. .................. | 438/671 |
| 7,704,882 | B2 * | 4/2010 | Lee et al. ..................... | 438/675 |
| 7,816,262 | B2 * | 10/2010 | Juengling .................... | 438/669 |
| 7,879,728 | B2 * | 2/2011 | Lam et al. .................... | 438/702 |
| 7,989,307 | B2 * | 8/2011 | Parekh et al. ................ | 438/424 |
| 8,018,070 | B2 * | 9/2011 | Blawid et al. ................ | 257/775 |
| 8,110,506 | B2 * | 2/2012 | Min et al. ..................... | 438/736 |
| 8,309,469 | B2 * | 11/2012 | Kajiwara ...................... | 438/717 |
| 8,492,282 | B2 * | 7/2013 | Devilliers .................... | 438/703 |
| 8,586,449 | B1 * | 11/2013 | Chang et al. ................. | 438/432 |
| 8,759,224 | B2 * | 6/2014 | Kim et al. .................... | 438/703 |
| 2010/0062380 | A1 | 3/2010 | Takemura et al. | |

* cited by examiner

*Primary Examiner* — Jarrett Stark
(74) *Attorney, Agent, or Firm* — Anova Law Group, PLLC

(57) ABSTRACT

Local interconnect structures and fabrication methods are provided. A dielectric layer can be formed on a semiconductor substrate. A first film layer can be patterned on the dielectric layer to define a region surrounded by a local interconnect structure to be formed. A sidewall spacer can be formed and patterned surrounding the first film layer on an exposed surface portion of the dielectric layer. A second film layer can be formed on the exposed surface portion of the dielectric layer and can have a top surface substantially flushed with a top surface of the sidewall spacer. The patterned sidewall spacer can be removed to form a first opening. After forming the first opening, the dielectric layer can be etched to form a second opening through the dielectric layer. The second opening can be filled with a conductive material to form the local interconnect structure.

20 Claims, 13 Drawing Sheets

LOCAL INTERCONNECT STRUCTURE AND FABRICATION METHOD

CROSS-REFERENCES TO RELATED APPLICATIONS

This application claims priority to Chinese Patent Application No. CN201310009755.3, filed on Jan. 10, 2013, the entire contents of which are incorporated herein by reference.

FIELD OF THE DISCLOSURE

The present disclosure relates to the field of semiconductor fabrication and, more particularly, relates to local interconnect structures and methods of making the local interconnect structures.

BACKGROUND

As critical dimensions of semiconductor devices shrink and semiconductor technology nodes (about half of a pitch) decrease, the 193 nm immersion lithography for forming a patterned mask layer encounters its physical limitations. Pitches between adjacent patterns are too small. The adjacent patterns may be undesirably connected with each other due to optical proximity effect (OPE). Conventional solutions include use of a double patterning method.

In the double patterning method, a pattern to be formed may be first split into two patterns including a first pattern and a second pattern. The critical dimensions of the first pattern and the second pattern can be twice of that of the pattern to be formed. By using such double patterning method, the optical proximity effect (OPE) generated, due to the overly small pitches between adjacent patterns, can be reduced.

FIGS. 1-2 illustrate a local interconnect structure formed by a conventional method. As shown in FIGS. 1-2, a first dielectric layer 101 is formed on a substrate that has semiconductor elements formed thereon. A plug contact 102 is formed in the first dielectric layer 101, and on the source, the drain and the gate 105. Then, an aluminum layer is formed on surface of the first dielectric layer 101. A double patterning method is used to etch the aluminum layer to form an L-shaped local interconnect structure 104. The L-shaped local interconnect structure 104 is connected to the plug contact 102 on the source or the drain at one end and is electrically connected to the plug contact on the gate electrode 105 at the other end.

When using the double patterning method to form the L-shaped interconnect structure 104, an L-shaped pattern can be divided into two line-shaped segments perpendicularly configured and intersected at one end of each line-shaped segment. The two line-shaped segments are used as an etch mask to etch the aluminum layer to form the L-shaped local interconnect structure 104.

However, as critical dimensions of semiconductor devices shrink, optical proximity effect (OPE) and undesirable connections between adjacent patterns may occur during the double patterning. The L-shaped local interconnect structure 104 may thus have large deformation, and the subsequently-formed local interconnect structures thus have un-accurate pattern. For example, subsequently a local interconnect structure may be formed on a spot where the local interconnect structure is not designed to be formed, which may cause leakage current to the semiconductor device. More seriously, if the formed L-shaped local interconnect structure is broken, the semiconductor device will not work.

BRIEF SUMMARY OF THE DISCLOSURE

One aspect of present disclosure includes a method of making a local interconnect structure. In the method, a dielectric layer can be formed on a semiconductor substrate. A first film layer can be patterned on the dielectric layer to define a region surrounded by a local interconnect structure to be formed and to expose a surface portion of the dielectric layer. A sidewall spacer can be formed surrounding the first film layer and on the exposed surface portion of the dielectric layer. The sidewall spacer can be patterned to define a position for forming the local interconnect structure to be formed. A second film layer can be formed on exposed surface portion of the dielectric layer. The second film layer has a top surface substantially flushed with a top surface of the sidewall spacer. The patterned sidewall spacer can be removed to form a first opening. After forming the first opening, the dielectric layer can be etched to expose a surface of the semiconductor substrate to form a second opening through the dielectric layer. The second opening can be filled with a conductive material to form the local interconnect structure.

Another aspect of present disclosure includes a local interconnect structure. The local interconnect structure can include a dielectric layer disposed on a semiconductor substrate. A first film layer can be disposed on the dielectric layer to define a region surrounded by a local interconnect structure and to expose a surface portion of the dielectric layer. A sidewall spacer can be disposed surrounding the first film layer and on the exposed surface portion of the dielectric layer. The sidewall spacer is patterned to define a position for the local interconnect structure. A second film layer can be disposed on the exposed surface portion of the dielectric layer, having a top surface substantially flushed with a top surface of the sidewall spacer. The local interconnect structure can be formed by: removing the patterned sidewall spacer to form a first opening; after forming the first opening, etching the dielectric layer to expose a surface of the semiconductor substrate to form a second opening through the dielectric layer; and filling the second opening with a conductive material to form the local interconnect structure.

Other aspects or embodiments of the present disclosure can be understood by those skilled in the art in light of the description, the claims, and the drawings of the present disclosure.

BRIEF DESCRIPTION OF THE DRAWINGS

FIGS. 6A-13A depict top views of an exemplary local interconnect structure at various stages during its formation in accordance with various disclosed embodiments;

FIGS. 6B-13B depict cross-sectional views of the exemplary local interconnect structure along an AA direction shown in FIGS. 6A-13A in accordance with various disclosed embodiments;

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

For illustration purposes, L-shaped interconnect structures and formation methods are described herein as examples only, although other types of interconnect structures having various shape(s), dimension(s), and/or position(s) along with their formation methods can be included in accordance with various embodiments.

Figure 1:
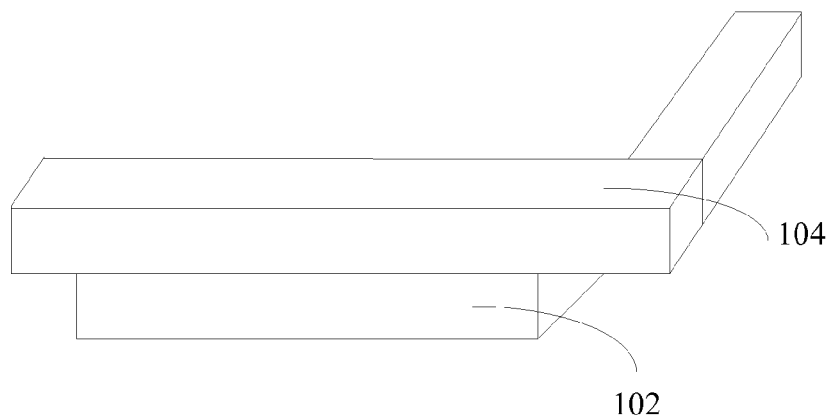
FIG. 1 depicts an conventional formation of a local interconnect structure.
Figure 2:
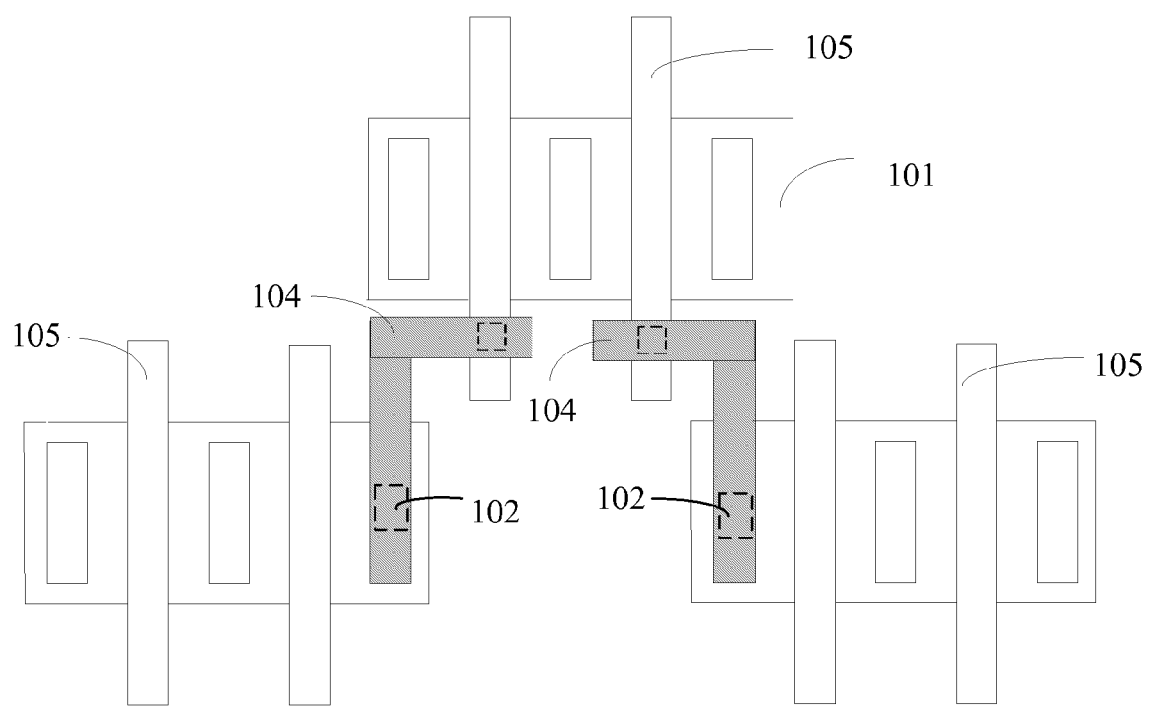
FIG. 2 depicts a top view of the conventionally-formed local interconnect structure.
Figure 3:
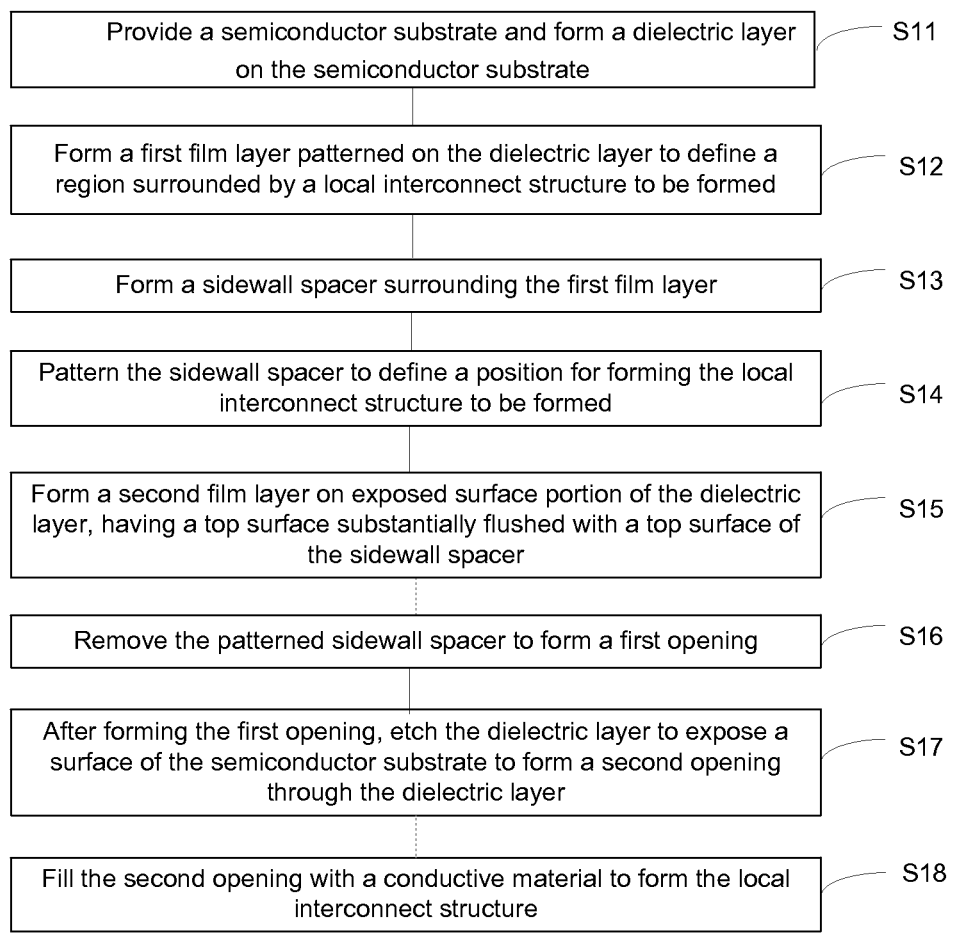
FIG. 3 depicts an exemplary method for forming a local interconnect structure in accordance with various disclosed embodiments.
Figure 4:
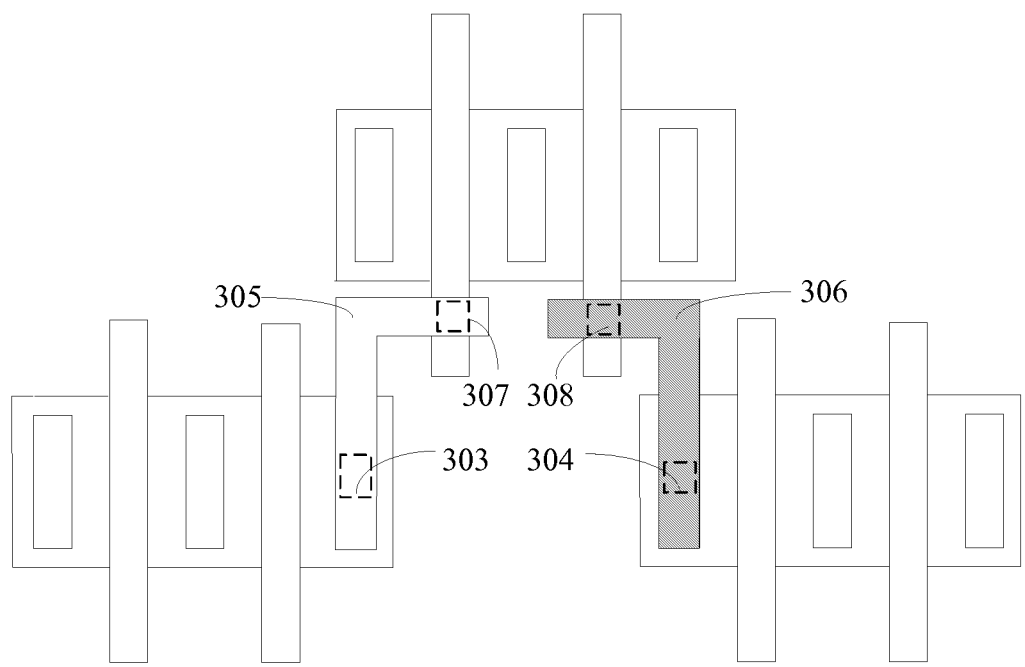
FIG. 4 depicts a top view of an exemplary local interconnect structure formed in accordance with various disclosed embodiments.

FIG. 3 depicts an exemplary method for forming a local interconnect structure and FIG. 4 depicts a top view of an exemplary local interconnect structure formed in accordance with various disclosed embodiments. As shown in FIG. 4, an L-shaped interconnect structure 305 can electrically connect a plug contact 303 of a source with a contact plug 307 of a gate. An L-shaped interconnect structure 306 can electrically connect a contact plug 304 of a drain with a contact plug 308 of a gate. The L-shaped interconnect structure can be formed as follows.

Referring to Step S11 of FIG. 3 and in FIGS. 4-5 and 6A-6B, a semiconductor substrate 200 is provided. A dielectric layer 201 is formed on the semiconductor substrate 200.

The semiconductor substrate 200 can be a monocrystalline substrate, a silicon-on-insulator (SOI) substrate, and/or other suitable substrate(s). Semiconductor devices including, e.g., a transistor, capacitor, and/or rectifier, can be formed on/in the semiconductor substrate 200.

The dielectric layer 201 can be formed on the semiconductor substrate 200 by a process including, e.g., chemical vapor deposition (CVD), physical vapor deposition (PVD), and the like. The dielectric layer 201 can be made of a material including, e.g., a low-k dielectric material such as $SiO_2$, SiOF, SiCOH, SiO, SiCO, SiCON, etc., and/or an ultra low-k dielectric material such as black diamonds.

Referring to FIG. 4, a transistor can be formed on the semiconductor substrate, the plug contacts 303, 304 (shown by dotted lines in FIG. 4) of the source and drain, and the plug contacts 307, 308 (shown by dotted lines in FIG. 4) of the gates are formed in the dielectric layer.

Figure 5:
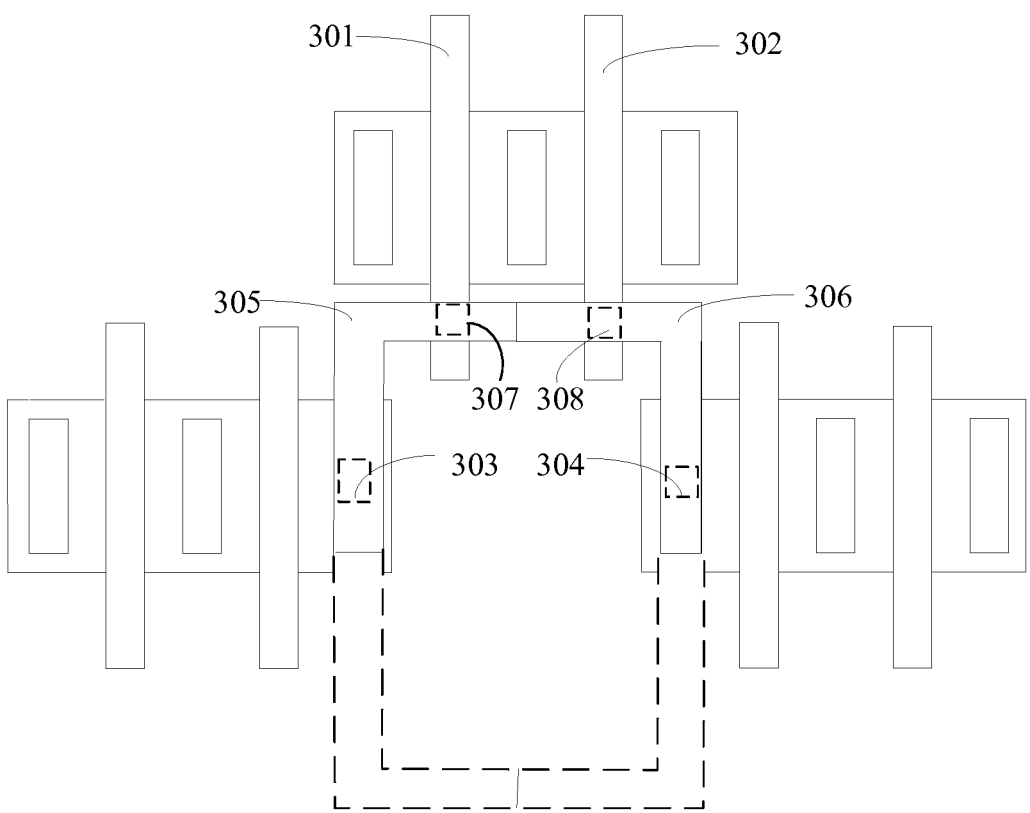
FIG. 5 depicts a top view of an exemplary local interconnect structure after patterning a first film layer in accordance with various disclosed embodiments.
Figure 6A:
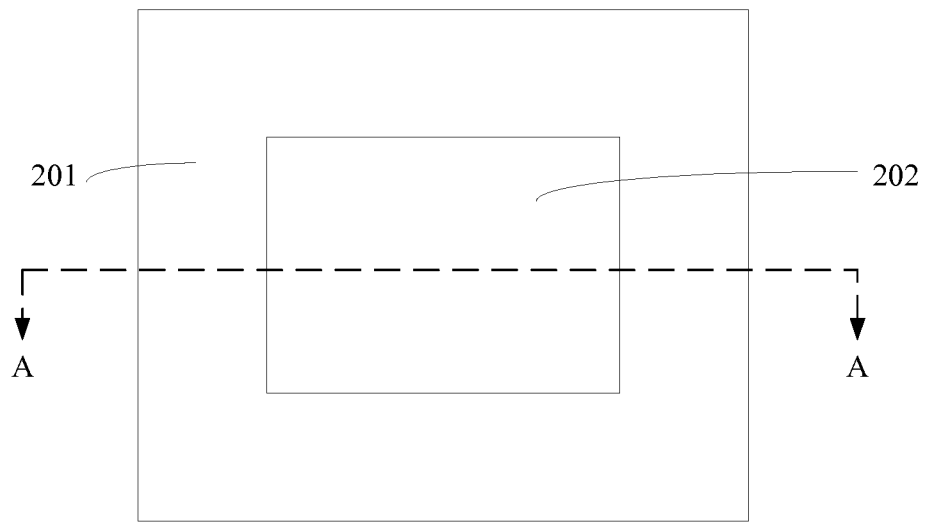
Figure 6B:
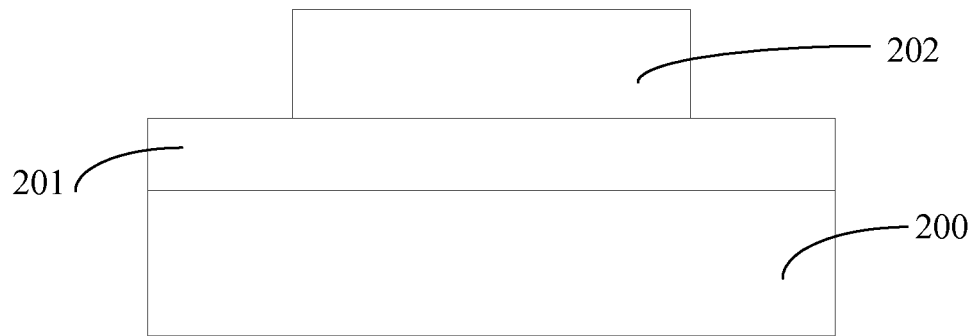

Referring to Step S12 of FIG. 3 and in FIGS. 5, 6A, and 6B, a first film layer 202 is formed on the dielectric layer 201 to define a region surrounded by local interconnect structure(s). The first film layer 202 can be a patterned first film layer.

A region surrounded by local interconnect structure(s) can be defined and determined according to a shape, dimension, orientation, and/or position of the interconnect structure(s) to be subsequently-formed. In one embodiment, the local interconnect structures to be formed can be L-shaped and the defined region surrounded by the local interconnect structures can include a square area.

For example, as shown in FIG. 4, when the plug contact 303 of the source and the plug contact 307 of the gate need to be connected to form a local interconnect structure that is L-shaped, and the plug contact 304 of the drain and the plug contact 308 of the gate need to be connected to form another local interconnect structure that is L-shaped, the defined region surrounded by local interconnect structures can include one rectangle, as shown in FIG. 5. Such rectangular defined region can be formed by two "positive" L-shaped local interconnect structures and two "inverted" L-shaped local interconnect structures. For example, the plug contact 303 of the source is connected to the plug contact 307 of the gate to form one L-shaped local interconnect structure, the plug contact 304 of the drain is connected to the plug contact 308 of the gate to form another L-shaped local interconnect structure, etc.

To form the patterned first film layer 202 shown in FIGS. 6A-6B, a material layer of the first film layer can be formed on the dielectric layer 201, followed by forming a patterned first mask layer (not shown) on the material layer of the patterned first film layer to define the region surrounded by local interconnect structure(s). The patterned first mask layer is used as an etch mask to etch the material layer of the first film layer to form the patterned first film layer 202.

For example, the first film layer 202 can have a shape including a quadrangle such as a square or a rectangle (as shown in FIG. 6A). The first film layer 202 can correspond to the region surrounded by the local interconnect structures. The first film layer 202 can be made of a material including, e.g., silicon oxide, silicon nitride, silicon oxynitride, polysilicon, and/or amorphous carbon. The first film layer 202 can be formed by any suitable deposition methods.

In one embodiment, the patterned first film layer can include a photoresist. When the first film layer is a photoresist, such photoresist can be exposed and developed and thus patterned from a material layer of the first film layer. There is thus no need to form the first mask layer on the material layer of the first film layer to pattern the first film layer. After forming the first film layer 202, the patterned first mask layer can be removed.

Figure 7A:
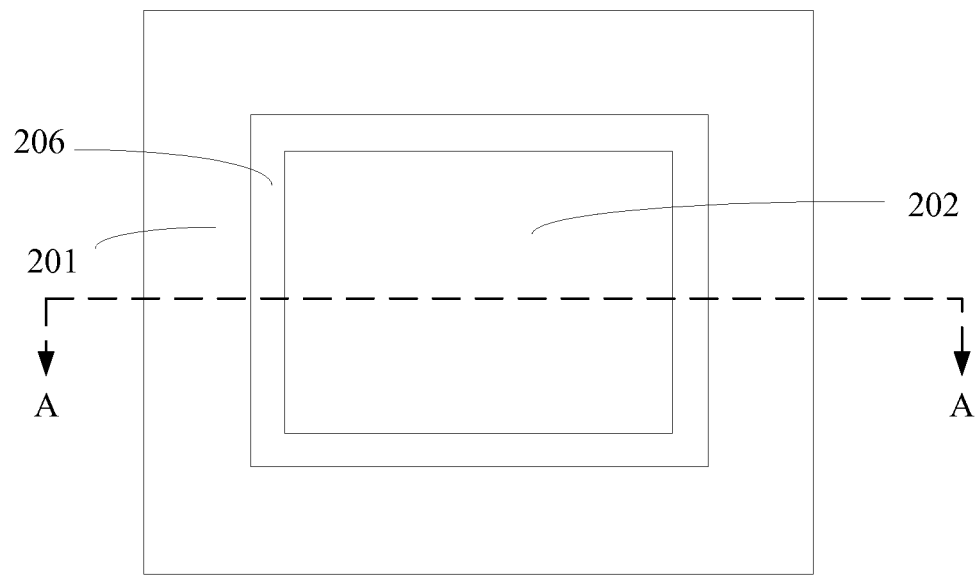
Figure 7B:

Referring to Step S12 of FIG. 3 and in FIGS. 7A-7B, a sidewall spacer 206 is formed to surround the first film layer 202. For example, after forming the patterned first film layer 202, a material layer (not shown) of the sidewall spacer can be formed on the dielectric layer 201 and the first film layer 202. The material layer of the sidewall spacer can be etched back to form the sidewall spacer 206.

Because the sidewall spacer 206 is formed around the patterned first film layer, the sidewall spacer 206 can have a shape or profile corresponding to a shape or profile of the patterned first film layer 202. It should be noted that, the sidewall spacer 206 formed herein and a subsequently formed second film layer may be polished (e.g., by chemical mechanical polishing) to form a sidewall spacer having an equal width from an upper end to a lower end.

Suitable materials are selected for the first film layer and the sidewall spacer, such that an etching selectivity ratio of the first film layer over the sidewall spacer can be greater than or equal 10:1, to ensure that, when subsequently removing the first film layer 202, the sidewall spacer can remain intact (e.g., substantially un-etched).

The sidewall spacer 206 can be made of a material including, e.g., silicon oxide, silicon nitride, silicon oxynitride, boron nitride, tantalum nitride, hafnium nitride, polycrystalline silicon, and/or amorphous carbon.

For example, when the first film layer 202 is made of a photoresist, the sidewall spacer 206 can be made of silicon nitride, silicon oxynitride, boron nitride, tantalum nitride, hafnium, and/or silicon. When the first film layer 202 is made of a material of silicon oxide, the sidewall spacer 206 can be made of a silicon nitride. When the first film layer 202 is made of silicon nitride, the sidewall spacer 206 can be made of a silicon oxide.

Figure 8A:
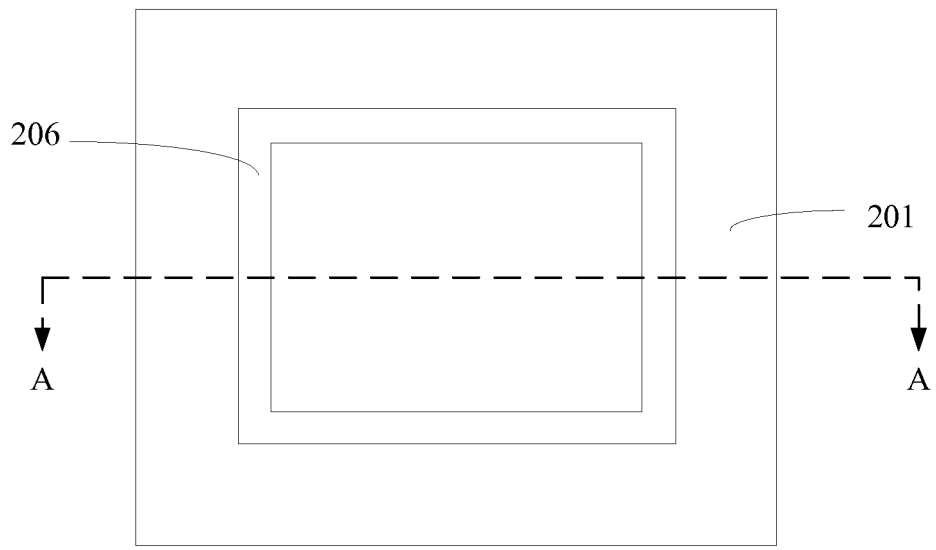
Figure 8B:
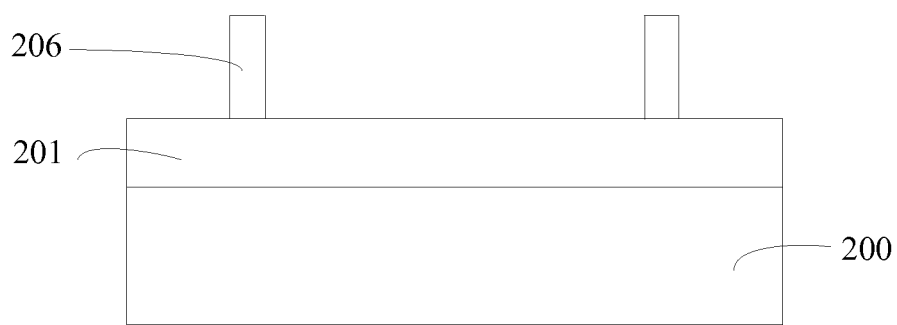

The sidewall spacer 206 can include a single layer structure and a stacked layer structure including multiple layers stacked on one another. Referring to FIGS. 8A-8B, after forming the sidewall spacer 206, the first film layer 202 can be removed, e.g., by a wet etching. After removal of the first film layer 202, the sidewall spacer 206 can have an exemplary shape as a rectangular box (or frame) as shown in FIG. 8A.

Figure 9A:
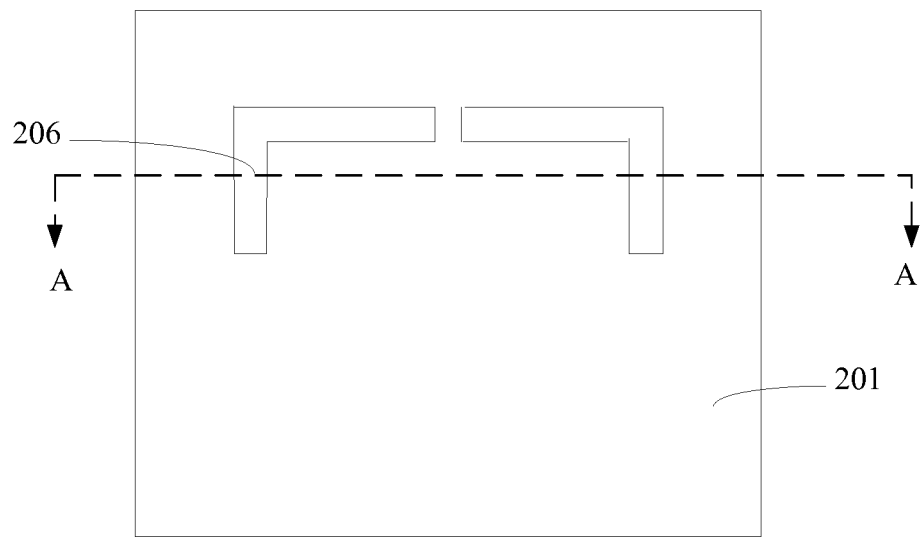
Figure 9B:
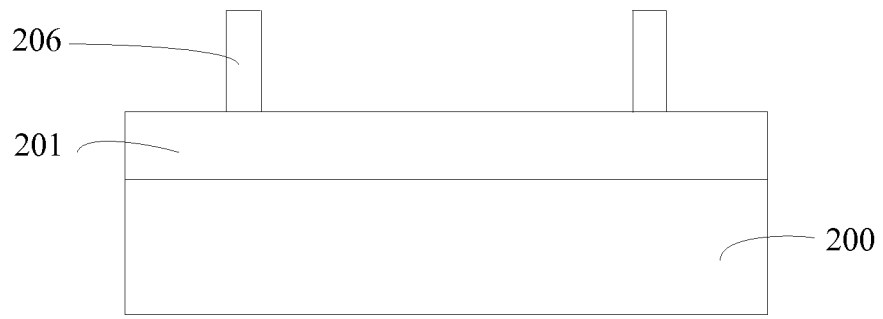

Referring to Step S14 of FIG. 3 and in FIGS. 9A-9B, the sidewall spacer 206 can be patterned to define location of the local interconnect structure(s) to be formed.

A patterned mask layer (not shown) can be formed on the sidewall spacer 206 of FIG. 8A to define the location of the local interconnect structure to be formed. The patterned mask layer can be used as a mask to etch the sidewall spacer 206 to form the patterned sidewall spacer. The patterned mask layer can then be removed.

In one embodiment, the sidewall spacer 206 can be etched by a dry etching to form an L-shaped sidewall spacer. The shape, dimension, orientation, and/or position of the L-shape can be controlled during the etching process.

Referring to FIG. 9A and FIG. 4, in one embodiment, an L-shape can include an upper-left-cornered L-shape and an upper-right-cornered L-shape, which can be used for the disclosed local interconnect structures.

Note that, L-shaped local interconnect structures are conventionally formed by photolithography to etch an aluminum layer. However, the L-shaped local interconnect structures often have small critical dimensions. Optical proximity effect such as diffraction may occur during the photolithography process and the L-shaped local interconnect structures are formed with large deformation having inaccurate position or shape.

As disclosed herein, a region and/or pattern is first defined by the surrounded subsequently-formed L-shaped local interconnect structures. For example, the defined region/pattern can include a rectangular first film layer 202. The rectangular first film layer 202 can have a large area. During the photolithography process to form the first film layer 202, the optical proximity effect can have less or no chances to occur, and thus less or no deformation (e.g., in shape) occurs to the formed first film layer 202.

Then, the sidewall spacer 206 can be formed surrounding the first film layer 202. After removal of the first film layer 202, a rectangular box can be formed by the sidewall spacer 206 having four corners each considered as an L-shape. The sidewall spacer 206, e.g., the rectangular box, can then be etched to keep the upper-left-corner and the upper-right-corner, while other two corners are removed.

During patterning of the sidewall spacer 206, even assuming that the optical proximity effect occurs, the shape and position of the L-shape at the corners of the sidewall spacer cannot be affected. Less or no deformations can occur. The subsequently-formed local interconnect structures can have more accurate shape, dimension, orientation, and/or position as designed.

Figure 10A:
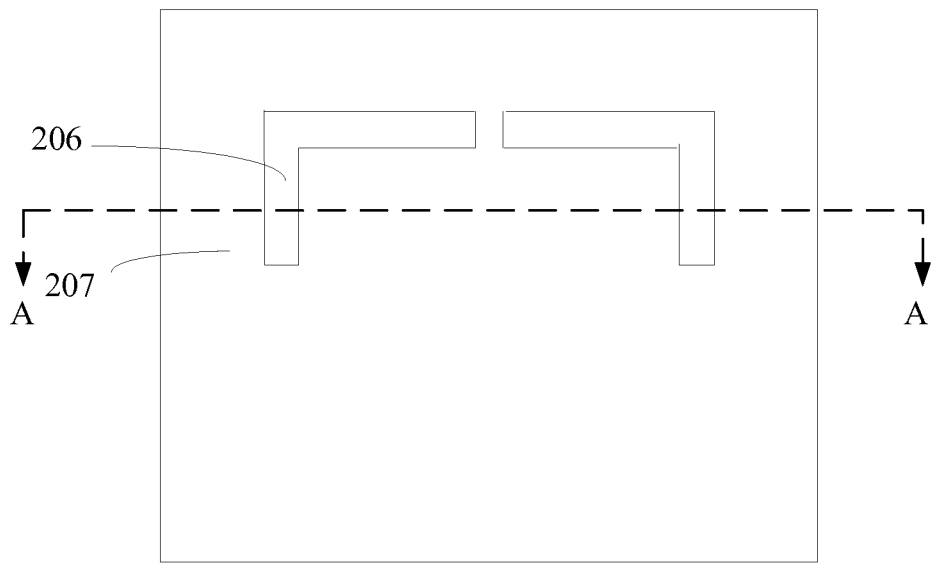
Figure 10B:

Referring to Step S15 of FIG. 3 and in FIG. 10A and FIG. 10B, a second film layer 207 is formed to cover the dielectric layer 201. The second film layer 207 can have a top surface substantially flushed with a top surface of the sidewall spacer 206. As used herein, the term "flushed with" may include a situation when the second film layer 207 is transparent that the second film layer 207 can have a top surface higher than the top surface of the sidewall spacer 206 and cover the sidewall spacer 206.

The second film layer 207 can be formed by: for example, depositing a second film layer over the dielectric layer 201, and using chemical mechanical polishing to remove a portion of the second film layer that is over the top surface of the patterned sidewall spacer 206.

It should be noted that, in an embodiment, when the sidewall spacer 206 is formed by an etching back process, the formed sidewall spacer includes an arcuate (or curved) sidewall spacer, which has inconsistent width between the upper end and lower end of the sidewall spacer. For example, the upper end of the formed arcuate sidewall spacer may have less width compared with the lower end.

In some cases, in order to obtain a same (consistent) width from the upper end to the lower end of the sidewall spacer, after removal of the portion of the second film layer 207 that is above the arcuate sidewall spacer, a CMP (chemical mechanical polishing) method can be used to remove upper portions of the sidewall spacer and the second film layer to form a sidewall spacer having a substantially-consistent width from the upper end to the lower end.

As disclosed herein, the sidewall spacer having a substantially-consistent width from the top to the bottom can facilitate the process for subsequently removing such sidewall spacer from the second film layer, and can also ensure that no residues of such sidewall spacer can be left within the second film layer 207 after the removal of the sidewall spacer.

Suitable materials are selected for the second film layer 207 and the sidewall spacer 206, such that an etching selectivity ratio of the first film layer over the sidewall spacer can be greater than or equal 1:5, to ensure that, when subsequently removing the sidewall spacer 206 from the second film layer 207, the second film layer 207 can remain intact (e.g., substantially un-etched).

For example, the second film layer 207 can be made of a material including, e.g., an amorphous carbon, a photoresist, an organic dielectric coating (ODL), a bottom anti-reflective coating (BARC), an organic planarizing layer (OPL), a near frictionless carbon coating (NFC), silicon nitride, silicon oxide and/or silicon oxynitride. Such materials are selected for forming the second film layer 207 to provide a desired fluidity and thus to provide the formed second film layer with smooth top and bottom surfaces. In addition, the second film layer 207 can be easily removed in a subsequent process.

Figure 11A:
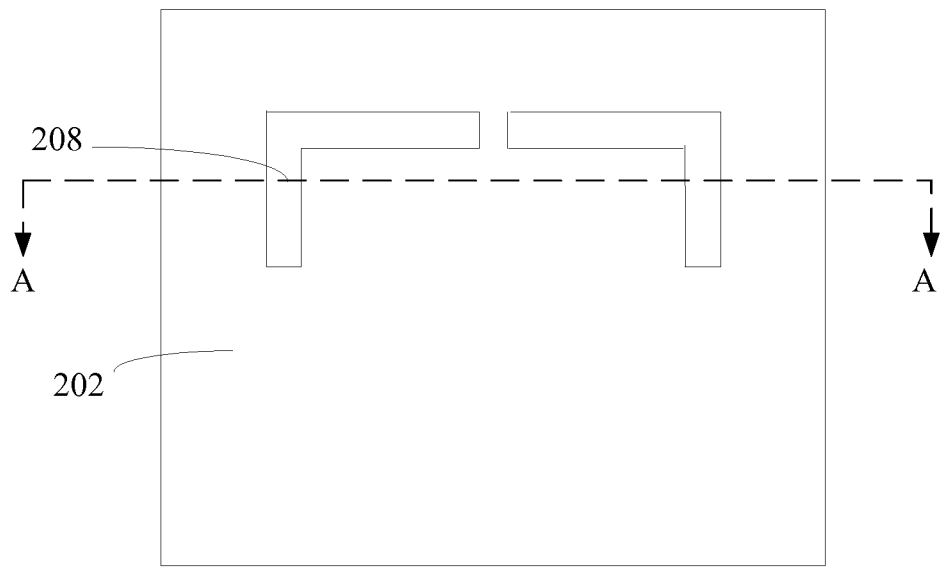
Figure 11B:
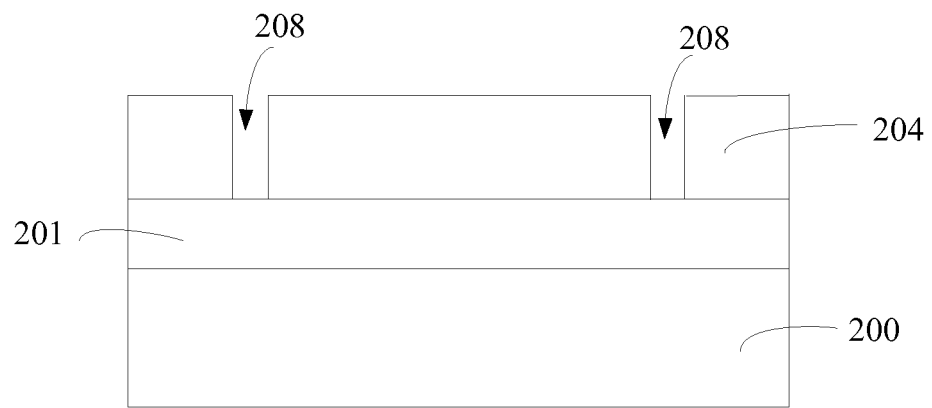

Referring to Step S16 in FIG. 3 and in FIGS. 11A-11B, the patterned sidewall spacer 206 is removed to form a first opening 208.

For example, the patterned sidewall spacer 206 can be removed by a dry etch or a wet etch. In one embodiment, a patterned mask layer can be formed on top of the second film layer and can be used as an etch mask to dry etch sidewall spacer within the second film layer.

The region/pattern of the first opening 208 in the second film layer 207 shown in FIG. 11 can be the region/pattern for the subsequently-formed local interconnect structures. The reason to remove the patterned sidewall spacer 206 from the second film layer 207 is to transfer the pattern (e.g., shape, dimension, position, etc.) of the local interconnect structures into the second film layer 207.

In one embodiment, the second film layer can be made of a non-transparent material including, e.g., silicon nitride, silicon oxide, and/or silicon oxynitride. When an etching back method is used to form the sidewall spacer 206, after forming the second film layer, the second film layer and the sidewall spacer 206 can be polished by a chemical mechanical polishing such that the sidewall spacer has a consistent (equal) width from the top to the bottom. Then, a dry etching can be used to remove the sidewall spacer 206 from the second film layer.

When the second film layer is made of a transparent material including, e.g., an organic dielectric coating (ODL), a bottom anti-reflective coating (BARC), etc., after forming the second film layer, the second film layer has a top surface higher than the top surface of the sidewall spacer 206. Because the position of sidewall spacer 206 can be seen from the transparent top of the second film layer, there is no need to perform a chemical mechanical polishing process on the sidewall spacer after the etching back process. The patterned mask layer can be directly formed on the second film layer and used as a mask to etch the second film layer and the sidewall spacer, to remove the sidewall spacer and to form the first opening.

Figure 12A:
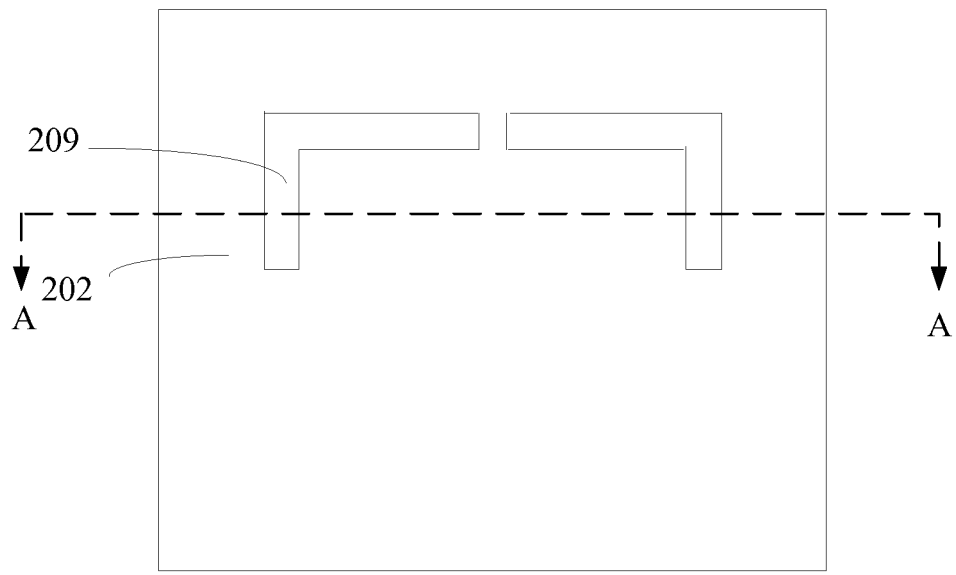
Figure 12B:
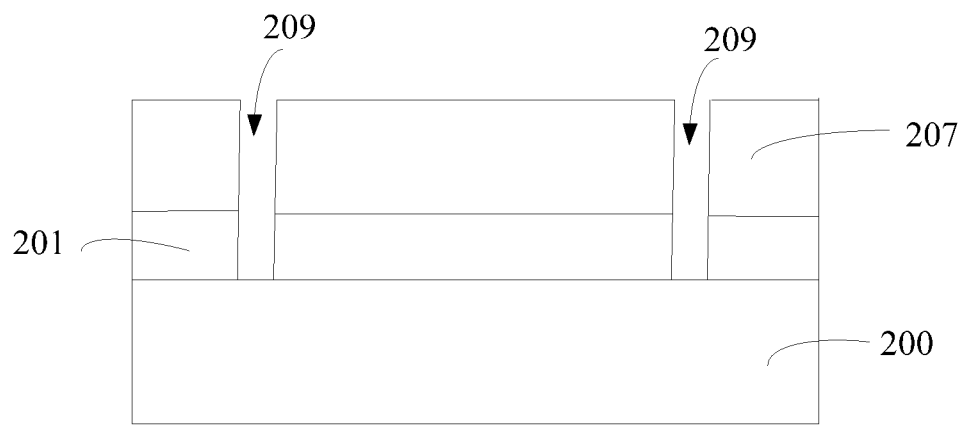

Referring to Step S17 in FIG. 3 and in FIGS. 12A and 12B, after forming the first opening 208, the dielectric layer 201 can be etched, e.g., by a dry etching, to expose a surface portion of the semiconductor substrate 200. A second opening 209 can be formed through the dielectric layer 201.

Figure 13A:
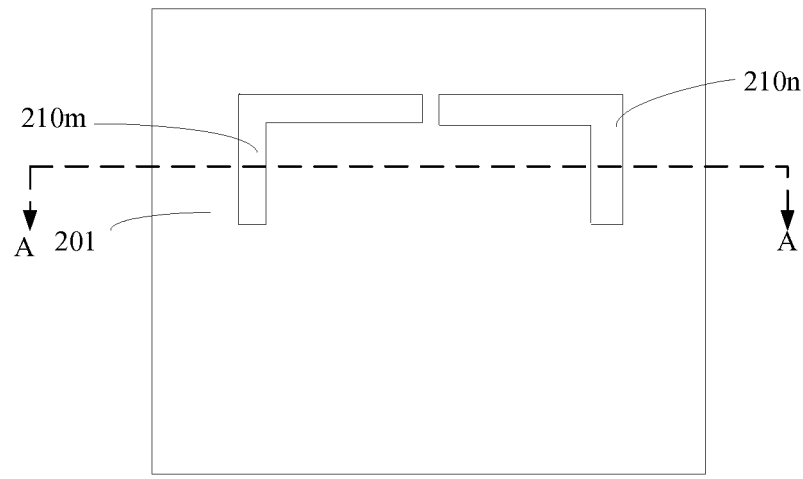
Figure 13B:
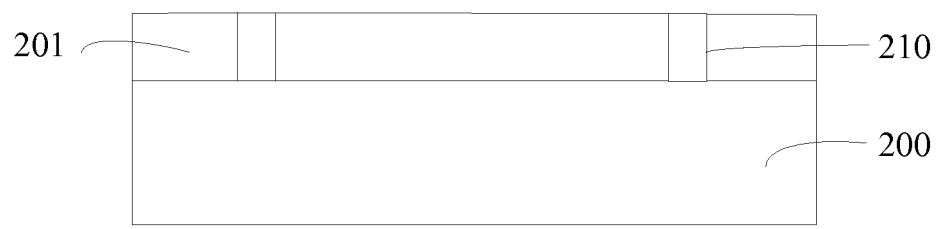

Referring to Step S18 of FIG. 3 and in FIG. 13A and FIG. 13B, the second openings 209 is filled with a conductive material to form a local interconnect structure 210. For example, the L-shaped local interconnect structure 210m in FIG. 13A may correspond to the local interconnect structure 305 in FIG. 4. The L-shaped local interconnect structure 210n in FIG. 13A may correspond to the local interconnect structure 306 in FIG. 4.

In one embodiment, after the second opening 209 is formed, the second film layer 207 can be removed and the second opening 209 can be filled with the conductive material. One reason for first removing the second film layer 207 and then filling the conductive material is because after the removal of the second film layer 207, sidewall height (e.g., of the second opening 209) can be reduced and thus the aspect ratio of the second opening 209 can be decreased. When subsequently filling the second opening 209 with a metal layer, the second opening 209 is not prone to forming internal voids, thus improving device performance.

The second film layer 207 can be removed by, e.g., an ashing method or a wet etching, depending on the material selected for the second film layer 207. For example, when the second film layer 207 is made of a photoresist or an amorphous carbon, the ashing method can be used. When the second film layer 207 is made of an organic dielectric coating (ODL), a bottom anti-reflective coating (BARC), an organic planarizing layer (OPL), a near frictionless carbon coating (NFC), silicon nitride, silicon oxide and/or silicon oxynitride, a wet etching can be used to remove the second film layer 207.

In one embodiment, the conductive material can be a metal including, e.g., aluminum, copper, and/or tungsten. In one example, aluminum is used, because aluminum has a low resistivity (e.g., about 3.65 $\mu\Omega$-cm). For example, aluminum can be deposited by a sputtering method in the second opening 209, followed by a rapid thermal annealing process to reflux at a high temperature. Of course, other metal and methods can be used. For example, copper can be electroplated in the second opening 209.

In other embodiments, when filling the second opening 209 with the conductive material 210, the second film layer 207 can be maintained without removal and/or the first film layer 202 can be maintained without removal. After the second opening 209 is filled in the conductive material, the second film layer 207 and the first film layer 202 can then be removed.

Note that, when the first film layer 202 is not removed in Step S12, accordingly, the second film layer 207 can be formed by, for example, depositing the second film layer material layer on the substrate 200, the patterned sidewall spacer 206, and the first film layer 202; and removing a portion of the patterned sidewall spacer 206 that is higher than the top surface of the second film layer 207.

Figure 14:
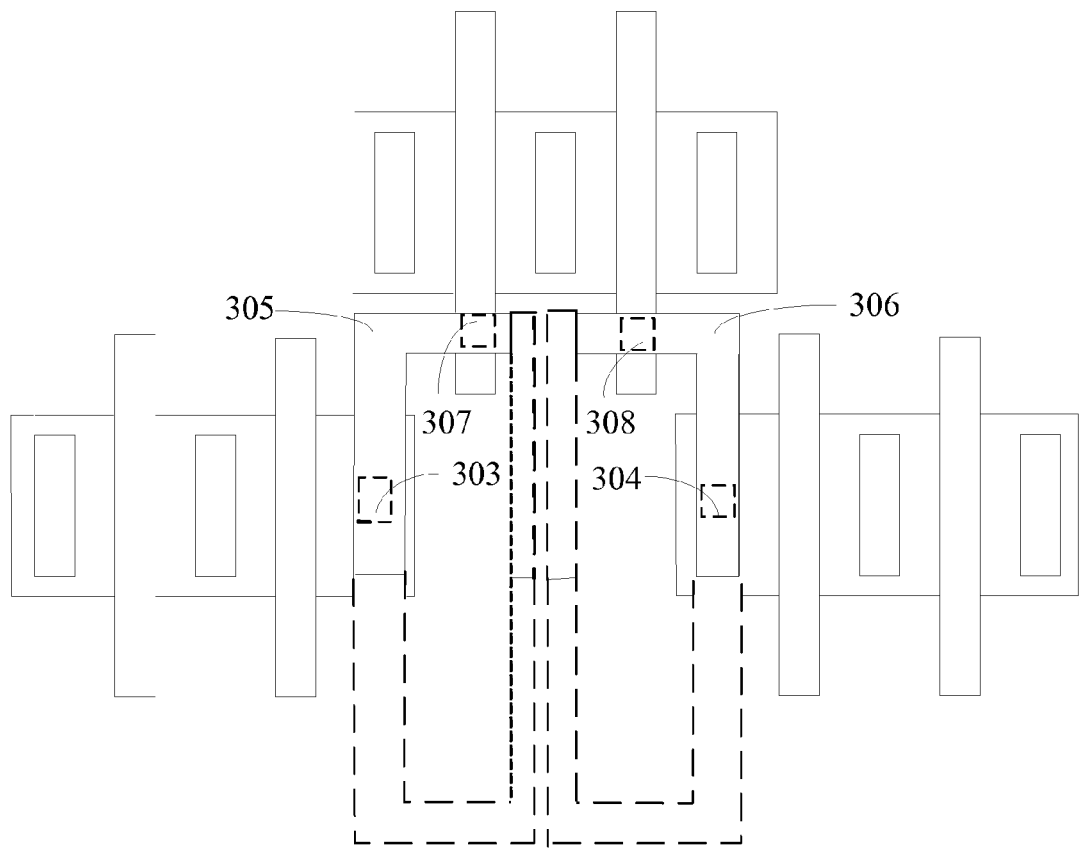
FIG. 14 depicts a top view of another exemplary local interconnect structure after patterning a first film layer in accordance with various disclosed embodiments.

In other embodiments, in FIG. 14 and FIG. 4, referring to Step S12 of FIG. 3, the region surrounded by the local interconnect structures may include two rectangular areas, the upper-left-cornered angle of one rectangle can be used for the L-shaped local interconnect structure 305 to electrically connect the plug contact 303 of the source with the plug contact 307 of the gate; and the upper-right-cornered angle of the other rectangle can be used for the L-shaped local interconnect structure 306 to electrically connect the plug contact 304 of the drain with the plug contact 308 of the gate.

The patterned sidewall spacer can have a shape including a rectangular upper-left corner for an L-shape and another rectangular upper-right corner for another L-shape. In other embodiments, when the shape of the local interconnect structure does not include a right angle but include an acute angle or obtuse angle formed by two segments intersecting at two endpoints from each segment, the region surrounded by the local interconnect structures can thus include a triangular or polygonal region. Accordingly, subsequently-formed local interconnect structure can be shaped having a corner angle of a triangle or a polygon.

In other embodiments, when the local interconnect structure is line-shaped, e.g., having a straight segment, the region surrounded by the local interconnect structures can be a triangular, square or polygonal region. A subsequently-formed local interconnect structure may be one side of the triangle, square or polygon.

Figure 15:
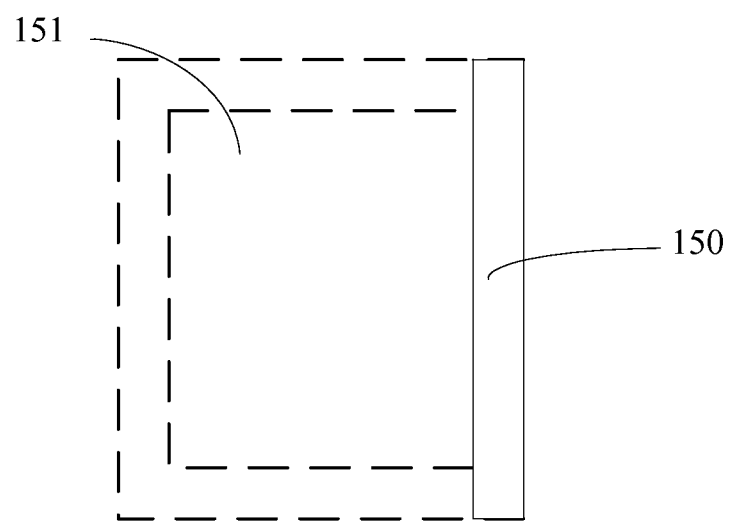
FIG. 15 depicts a top view of an exemplary local interconnect structure after patterning a second film layer in accordance with various disclosed embodiments.

For example, referring to FIG. 15, when to form a line-shaped local interconnect structure 150, the region surrounded by the local interconnect structure(s) can be a square-shaped region, having the local interconnect structure 150 as one of the sides of the square-shaped region.

In other embodiments, when the local interconnect structure is arc-shaped, the region surrounded by the local interconnect structures can be a circle, or a semicircle. A subsequently-formed local interconnect structure may be an arc segment of the circle, or the semicircle.

In other embodiments, the method of forming the sidewall spacer 206 depicted in Step S14 can include, for example, forming a sidewall spacer material layer on the dielectric layer and the first film layer; forming a patterned mask layer on the sidewall spacer material layer to define a position for forming the sidewall spacer; using the patterned mask layer as a mask to etch the sidewall spacer material layer; removing the patterned mask layer after etching; and removing the sidewall spacer material layer on top of the first film layer such that the first film layer has a top surface flushed with a surface of the etched sidewall spacer material layer surrounding the first film layer.

The removal of the sidewall spacer material layer from top of the first film layer can include a chemical mechanical polishing process. In this case, the formed sidewall spacer can have a consistent width (a same width) from the top surface to the bottom surface of the sidewall spacer without removing the top of the sidewall spacer. It should be noted that a photolithography process can be used to form the sidewall spacer. Due to a large area of the patterned mask layer, almost no optical proximity effect may occur, and the shape and position of the sidewall spacer would not be deformed.

In various embodiments, in addition to forming the local interconnect structure connecting plug contacts between the source (or drain) and the gate, the disclosed interconnect structure can be used in any interlayer interconnect technology for semiconductor devices to form local interconnect structures.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of making a local interconnect structure, comprising:
    providing a semiconductor substrate;
    forming a dielectric layer on the semiconductor substrate;
    forming a first film layer patterned on a first surface portion of the dielectric layer;
    forming a sidewall spacer having a thickness only on sidewalls of the first film layer to surround the first film layer on the dielectric layer by a patterning process;
    further patterning the sidewall spacer by removing a portion of the sidewall spacer to expose a second surface portion of the dielectric layer and to leave a pattern made by remainng sidewall spacer;
    forming a second film layer on the exposed second surface portion of the dielectric layer, wherein the second film layer has a top surface substantially flushed with a top surface of the remaining sidewall spacer;
    removing the remaining sidewall spacer to form a first opening such that the first opening has a same pattern as the pattern of the remaining sidewall spacer;
    etching the dielectric layer via the first opening to expose a surface of the semiconductor substrate to form a second opening through the dielectric layer, the second opening having the same pattern; and
    filling the second opening with a conductive material to form a local interconnect structure having the same pattern as the pattern of the remaining sidewall spacer after the further patterning.

2. The method of claim 1, further including:
    after forming the sidewall spacer and before patterning the sidewall spacer, removing the first film layer to expose the first surface portion of the dielectric layer, and
    forming the second film layer on the exposed first and second surface portions of the dielectric layer.

3. The method of claim 1, wherein, after forming the second opening and before filling the conductive material, the method further includes:
    removing the first film layer and the second film layer.

4. The method of claim 1, wherein forming the first film layer patterned on the dielectric layer include:
    forming a material layer of the first film layer on the dielectric layer;
    forming a first mask layer on the material layer of the first film layer to define the region surrounded by the local interconnect structure to be formed;
    using the first mask layer as an etch mask to etch the material layer of the first film layer to form the first film layer; and
    after etching the material layer of the first film layer, removing the first mask layer.

5. The method of claim 1, wherein the local interconnect structure having the same pattern as the pattern of the remaining sidewall spacer includes two line-shaped segments intersected to provide an angle at an endpoint of each of the two line-shaped segments, and a region surrounded by the local interconnect structure includes a triangular, quadrangular, or polygonal shape.

6. The method of claim 1, wherein the local interconnect structure having the same pattern as the pattern of the remaining sidewall spacer is L-shaped, and a region surrounded by the local interconnect structure includes a quadrangular shape.

7. The method of claim 1, wherein the local interconnect structure having the same pattern as the pattern of the remaining sidewall spacer is arc-shaped, and a region surrounded by the local interconnect structure includes a circular or a semi-circular shape.

8. The method of claim 1, wherein forming the sidewall spacer to surround the first film layer by the patterning process includes:
    forming a sidewall spacer material layer on the dielectric layer and the first film layer;
    etching back the sidewall spacer material layer to form the sidewall spacer; and
    after forming the second film layer, removing a thickness portion of the second film layer and a thickness portion of the sidewall spacer by a chemical mechanical polishing such that the sidewall spacer has an equal width from the top surface to a bottom surface.

9. The method of claim 1, wherein forming the sidewall spacer to surround the first film layer includes:
    forming a sidewall spacer material layer on the dielectric layer and the first film layer;
    polishing the sidewall spacer material layer by a chemical mechanical polishing such that the sidewall spacer material layer has a top surface substantially flushed with a top surface of the first film layer;
    after polishing, forming a second mask layer on the first film layer and on the sidewall spacer material layer to define a position for forming the sidewall spacer;
    using the second mask layer as an etch mask to etch the polished sidewall spacer material layer to form the sidewall spacer; and
    removing the second mask layer after etching the polished sidewall spacer material layer.

10. The method of claim 1, wherein patterning the sidewall spacer include:
    forming a third mask layer on the sidewall spacer to define the position for forming the local interconnect structure;
    using the third mask layer as an etch mask to etch the sidewall spacer; and
    after etching the sidewall spacer, removing the third mask layer.

11. The method of claim 1, further including:
    selecting a material for each of the first film layer and the sidewall spacer such that an etching selectivity ratio of the first film layer over the sidewall spacer is about 10:1 or greater.

12. The method of claim 1, wherein the first film layer is formed of a material including silicon oxide, silicon nitride, silicon oxynitride, silicon, amorphous carbon, or acombination thereof.

13. The method of claim 1, wherein the first film layer includes a photoresist material.

14. The method of claim 1, wherein the sidewall spacer is made of a material including silicon oxide, silicon nitride, silicon oxynitride, boron nitride, tantalum nitride, hafnium nitride, polycrystalline silicon, amorphous carbon, or a combination thereof.

15. The method of claim 1, further including:
    selecting a material for each of the sidewall spacer and the second film layer such that an etching selectivity ratio of the sidewall spacer over the second film layer is about 5:1 or greater.

16. The method of claim 1, wherein the second film layer is made of a material including, an amorphous carbon, a photoresist, an organic dielectric coating (ODL), a bottom anti-reflective coating (BARC), an organic planarizing layer (OPL), a near frictionless carbon coating (NFC), silicon nitride, silicon oxide, silicon oxynitride, or a combination thereof.

17. The method of claim 1, wherein forming the second film layer includes:
   depositing a second film layer material on the semiconductor substrate; and
   removing a portion of the second film layer material that is over a top surface of the sidewall spacer after patterning to form the second film layer.

18. The method of claim 1, wherein the conductive material includes aluminum, copper, tungsten, or a combination thereof.

19. The method of claim 1, further including:
   after forming the second opening through the dielectric layer and before filling the conductive material, removing the second film layer from the dielectric layer.

20. The method of claim 2, further including:
   after forming the second opening through the dielectric layer and before filling the conductive material, removing the second film layer from the dielectric layer.

* * * * *